United States Patent
Chang et al.

(10) Patent No.: US 9,929,090 B2
(45) Date of Patent: Mar. 27, 2018

(54) ANTIFUSE ELEMENT USING SPACER BREAKDOWN

(71) Applicant: INTEL CORPORATION, Santa Clara, CA (US)

(72) Inventors: Ting Chang, Portland, OR (US); Chia-Hong Jan, Portland, OR (US); Walid M. Hafez, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/117,621

(22) PCT Filed: Mar. 24, 2014

(86) PCT No.: PCT/US2014/031592
§ 371 (c)(1),
(2) Date: Aug. 9, 2016

(87) PCT Pub. No.: WO2015/147782
PCT Pub. Date: Oct. 1, 2015

(65) Prior Publication Data
US 2016/0351498 A1    Dec. 1, 2016

(51) Int. Cl.
*H01L 23/52* (2006.01)
*H01L 23/525* (2006.01)
(Continued)

(52) U.S. Cl.
CPC ........ *H01L 23/5252* (2013.01); *G11C 17/143* (2013.01); *G11C 17/16* (2013.01);
(Continued)

(58) Field of Classification Search
CPC .................. H01L 23/5252; H01L 27/11206
See application file for complete search history.

(56) References Cited

U.S. PATENT DOCUMENTS

| | | | |
|---|---|---|---|
| 4,442,507 A | 4/1984 | Roesner | |
| 8,120,072 B2 * | 2/2012 | Mouli | H01L 27/098 257/134 |

(Continued)

FOREIGN PATENT DOCUMENTS

| | | |
|---|---|---|
| EP | 0684646 A1 | 11/1995 |
| KR | 20040060475 A | 7/2004 |
| WO | 2015147782 A1 | 10/2015 |

OTHER PUBLICATIONS

International Search Report and Written Opinion as received for Patent Application No. PCT/US2014/031592, dated Dec. 23, 2014. 10 pages.

(Continued)

*Primary Examiner* — Jamie C Niesz
(74) *Attorney, Agent, or Firm* — Finch & Maloney PLLC

(57) ABSTRACT

Techniques and circuitry are disclosed for efficiently implementing programmable memory array circuit architectures, including both non-volatile and volatile memories. The memory circuitry employs an antifuse scheme that includes an array of 1 T bitcells, wherein each bitcell effectively contains one gate or transistor-like device that provides both an antifuse element and a selector device for that bitcell. In particular, the bitcell device has asymmetric trench-based source/drain contacts such that one contact forms a capacitor in conjunction with the spacer and gate metal, and the other contact forms a diode in conjunction with a doped diffusion area and the gate metal. The capacitor serves as the antifuse element of the bitcell, and can be programmed by breaking down the spacer. The diode effectively provides a Schottky junction that serves as a selector device which can eliminate program and read disturbs from bitcells sharing the same bitline/wordline.

25 Claims, 7 Drawing Sheets

(51) Int. Cl.
    *H01L 23/62*    (2006.01)
    *G11C 17/14*    (2006.01)
    *G11C 17/16*    (2006.01)
    *H01L 27/112*   (2006.01)
    *H01L 27/102*   (2006.01)

(52) U.S. Cl.
    CPC ............ *G11C 17/165* (2013.01); *H01L 23/62* (2013.01); *H01L 27/1021* (2013.01); *H01L 27/11206* (2013.01); *H01L 2924/0002* (2013.01)

(56) References Cited

U.S. PATENT DOCUMENTS

| | | |
|---|---|---|
| 2004/0232509 A1 | 11/2004 | Vyvoda |
| 2007/0257331 A1 | 11/2007 | Kurjanowicz et al. |
| 2008/0211540 A1 | 9/2008 | Fujita |
| 2008/0272395 A1* | 11/2008 | Banna ............. H01L 29/0843 257/190 |
| 2009/0072212 A1 | 3/2009 | Van Der Sluis et al. |
| 2010/0090213 A1 | 4/2010 | Jeong et al. |
| 2010/0327363 A1 | 12/2010 | Nakabayashi |
| 2012/0009743 A1* | 1/2012 | Boyle ............. G11C 7/062 438/189 |
| 2012/0044740 A1 | 2/2012 | Chung |
| 2012/0329226 A1* | 12/2012 | Mouli ............. H01L 21/76232 438/270 |
| 2013/0059238 A1* | 3/2013 | Kurjanowicz ......... G11C 17/16 430/5 |
| 2013/0308366 A1 | 11/2013 | Chung |

OTHER PUBLICATIONS

Office Action and Search Report received for TW Application No. 104104228, dated Mar. 10, 2016. 13 pages; including 5 pages of English translation.

International Preliminary Report on Patentability received for Patent Application No. PCT/US2014/031592, dated Oct. 6, 2016. 7 pages.

Extended European Search Report received for EP Application No. 14887643.6, dated Oct. 20, 2017. 8 pages.

Herner, et al., "Polycrystalline silicon/CoSi2 Schottky diode with integrated SiO2 antifuse: a nonvolatile memory cell," Applied Physics Letters, vol. 82, No. 23. Jun. 9, 2003. pp. 4163-4165.

* cited by examiner

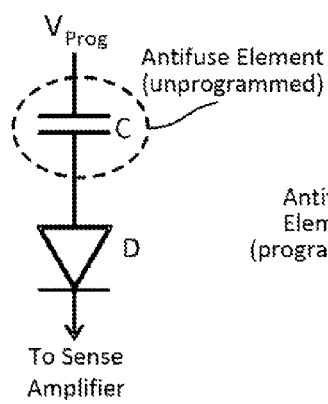 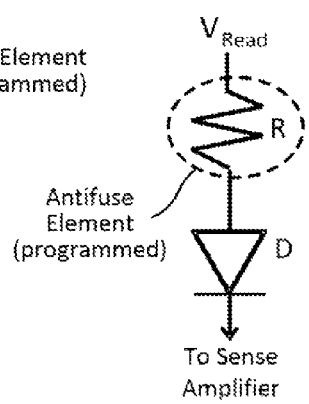 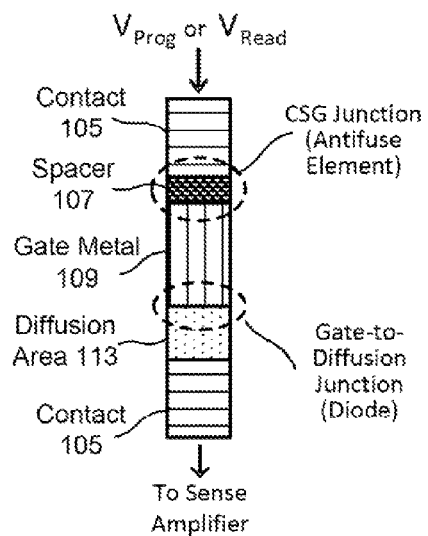
Fig. 3a        Fig. 3b        Fig. 3c
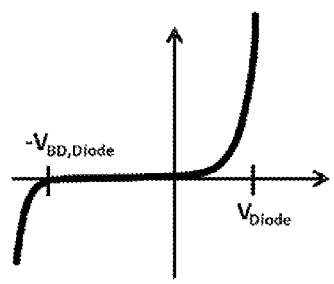 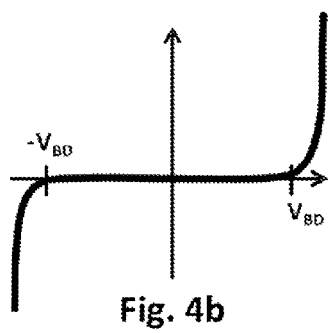
Fig. 4a        Fig. 4b

ANTIFUSE ELEMENT USING SPACER BREAKDOWN

FIELD OF THE DISCLOSURE

The present disclosure relates to memory circuits, and more particularly, to integrated antifuse programmable memory.

BACKGROUND

Programmable memory devices such as programmable read-only memory (PROM) and one-time programmable read-only memory (OTPROM) are typically programmed by either destroying links (via a fuse) or creating links (via an antifuse) within the memory circuit. In PROMs, for instance, each memory location or bit contains a fuse and/or an antifuse, and is programmed by triggering one of the two. Once programming is performed, it is generally irreversible. The programming is usually done after manufacturing of the memory device, and with a particular end-use or application in mind.

Fuse links are commonly implemented with resistive fuse elements that can be open-circuited or 'blown' with an appropriate amount of high-current. Antifuse links, on the other hand, are implemented with a thin barrier layer of non-conducting material (such as silicon dioxide) between two conductor layers or terminals, such that when a sufficiently high voltage is applied across the terminals, the silicon dioxide or other such non-conducting material is effectively turned into a short-circuit or otherwise low resistance conductive path between the two terminals.

BRIEF DESCRIPTION OF THE DRAWINGS

FIG. 3a schematically illustrates an unprogrammed 1 T bitcell of an antifuse memory device configured in accordance with an embodiment of the present disclosure.

FIG. 3b schematically illustrates a programmed 1 T bitcell of an antifuse memory device configured in accordance with an embodiment of the present disclosure.

FIG. 3c illustrates the various integrated circuit layers comprising a 1 T bitcell of an antifuse memory device configured in accordance with an embodiment of the present disclosure.

FIGS. 4a-b illustrate current-voltage characteristics of a 1 T bitcell of an antifuse memory device configured in accordance with an embodiment of the present disclosure.

DETAILED DESCRIPTION

Figure 1:
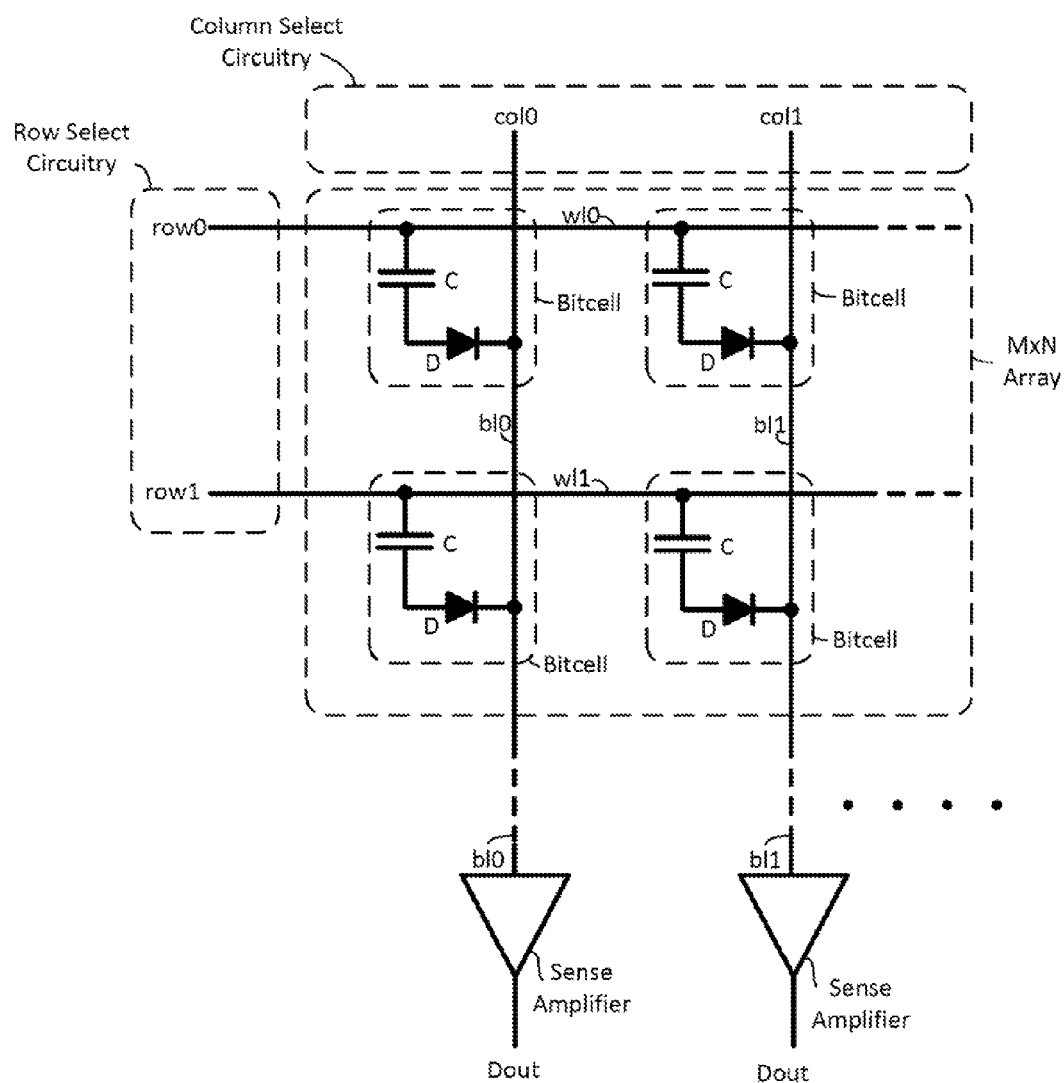
FIG. 1 schematically illustrates an antifuse memory device configured in accordance with an embodiment of the present disclosure.

Techniques and circuitry are disclosed for efficiently implementing programmable memory array circuit architectures, such as PROM, OTPROM, and other such programmable non-volatile and volatile memories. The circuitry employs an antifuse scheme that includes an array of 1 T memory bitcells, wherein each bitcell effectively contains one gate or transistor-like device that provides both an antifuse element and a selector device for that bitcell. In particular, the bitcell device has asymmetric trench-based source/drain contacts such that one contact forms a capacitor in conjunction with the spacer and gate metal. The other contact of the bitcell device forms a diode in conjunction with the doped diffusion area and the gate metal. The capacitor serves as the antifuse element of the bitcell, and can be programmed by breaking down the spacer. The diode-like element effectively provides a Schottky junction or barrier that serves as a selector device which can eliminate program and read disturbs from bitcells sharing the same bitline/wordline. As will be appreciated, the 1 T anti-fuse element design enhances packing density as the breakdown layer is a vertical spacer instead of a horizontal gate dielectric, eliminating additional areas to accommodate the selector device. Just as with gate dielectric breakdown, spacer breakdown is a secure mechanism which cannot be decoded with reverse engineering. The bitcell configuration can be used in conjunction with column/row select circuitry, power selector circuitry, and/or readout circuitry to provide high-density memory array circuit designs and layouts. The techniques can be embodied, for example, in discrete memory devices (e.g., non-volatile and volatile memory chips), integrated system designs (e.g., purpose-built silicon), or on-chip memory (e.g., microprocessor with on-chip non-volatile cache). Numerous other embodiments, variations, and applications will be apparent in light of this disclosure.

General Overview

Typically, breakdown of gate oxide is the mainstream technology employed in memory arrays, where a given bitcell uses a select transistor to access a second transistor whose gate oxide will be broken down when selected to be programmed. This typical bitcell configuration requires two transistors (2 T) to accomplish the task. Some more current designs employ a 1.5 T structure to reduce the area penalty. This present disclosure provides a bitcell configuration that uses only 1 T (one transistor-like device), thereby allowing an even higher packing density. In accordance with an embodiment, this 1 T bitcell device includes a built-in capacitor (antifuse element) and a built-in Schottky diode (selector element). The capacitor comprises one contact of the bitcell device, the vertical spacer material, and the gate metal. The built-in diode comprises the other contact of the bitcell device, the diffusion area, and the gate metal. The built-in capacitor can be programmed to a logical '1' or '0' (based on readout levels caused by the resistance of that capacitor element after programming), and the built-in diode serves as the selector that suppresses program and read disturbs from neighboring bitcells sharing the same wordlines or bitlines.

So, the anti-fuse element utilizes gate spacer breakdown as the programming mechanism and does not require an additional transistor gate oxide layer for breakdown (as do 2 T or 1.5 T anti-fuse devices). An antifuse memory circuit as provided herein can be manufactured using standard CMOS processes, and utilizes as few as one additional mask when integrated with current replacement metal gate (RMG)

and thick-gate processes. For instance, the fabrication process can be almost the same as for transistor fabrication, except that gate dielectric need not be provisioned and the source/drain contacts are provisioned in an asymmetric fashion (as will be discussed with reference to FIGS. 2a-2c). Using the vertical spacer material for breakdown instead of a horizontal gate dielectric reduces bitcell footprint. The manufacturing process is fully compatible, for example, with high-k metal gate FinFET processes. An additional mask can be used to skip gate dielectrics on the 1 T bitcell array. Similar processes can be used to make high-k metal gate planar device processes, so long as one of the source/drain contact can be used in conjunction with the vertical dielectric spacer material and the gate metal to form the antifuse element (capacitor). By implementing the source/drain contacts in an asymmetric fashion, one of the contacts is ultimately implemented so that it does not contact a diffusion area, so that the only path for voltage breakdown is across the dielectric spacer material.

Use of the disclosed techniques/structure can be identified cross-sectionally with imaging techniques (e.g., scanning electron microscopy or SEM, transmission electron microscopy or TEM) of a given integrated circuit or other device that has a 1 T bitcell structure that uses a vertical spacer breakdown for the antifuse element of the bitcell, as variously described herein. Discrete parts of the 1 T bitcell, including the spacer to gate breakdown (the antifuse element) and the gate to substrate junction (diode), can be independently verified. As will be further appreciated in light of this disclosure, dielectric spacers which are typically formed proximate to the gate stack can be implemented with about the same thickness and quality as gate dielectrics which break down in a similar voltage range. In addition, Schottky turn-on voltage is comparable to transistor threshold voltage, and can be further tuned through work function engineering.

Numerous embodiments and configurations that use a vertical spacer for memory storage, whether one-time, volatile, or non-volatile, combined with a diode-type selector can be realized by, for example, changing the dielectric spacer materials and biasing conditions. The antifuse-based programmable memories described herein can be used in numerous applications, such as discrete memory devices as well as in microprocessors or other on-chip programmable memory applications, where the programmable nature enables functions such as cache repair, post-silicon circuit trimming/tuning, code storage, and security applications such as on-chip encryption key storage. Other suitable applications will be apparent in light of this disclosure, due to high packing density.

Memory Device Architecture

FIG. 1 schematically illustrates an antifuse memory device configured in accordance with an embodiment of the present disclosure. As can be seen, the device generally includes column select circuitry, row select circuitry, and an M×N array of bitcells (only 2×2 array is shown, but M and N can be any integer values, as will be apparent in light of this disclosure.

The actual array size will depend on the given application and desired storage capacity. Specific examples include a 32-row by 32-column organization, a 64-row by 64-column organization, or a 32-row by 128-column organization. Further note that the number of rows M need not match the number of columns N.

As can be further seen, each bitcell includes a capacitor-like antifuse element C and a diode-like selector element D connected to one another in a serial fashion such that one terminal of the antifuse element C is connected to the anode of the selector element D. The other terminal of the antifuse element C is connected to a corresponding wordline (wl0, wl1, . . . , wlM−1) depending on the bitcell row, and the cathode terminal the selector element D is connected to a corresponding bitline (bl0, bl1, . . . , blN−1) depending on the bitcell column. Each wordline is driven by a corresponding row select circuit included in the row select circuitry, and each bitline is driven by a corresponding column select circuit included in the column select circuitry. In addition, each bitline is connected to its own sense amplifier, which provides a readout for that column.

The implementation details of the row and column select circuitry will generally depend on the desired bias voltages during programming and readout. In one example embodiment, each row and column select circuit can be implemented with a field effect transistor (FET) or other suitable switching element where the gate of the transistor receives a select signal that allows selection of a given row or column. Once the gate signal is received, a bias voltage available at the FET source is passed to the FET drain, which effectively drives the corresponding wordline or bitline. In any such cases, the desired biasing scheme for programming and readout will instruct the specific configuration details of the row and column select circuitry. A controller (off-chip or on-chip) can be used to provide the select signals to the row and column switching elements. As is known, the controller can be configured to translate read and write commands into the appropriate row/column select signals so that the appropriate bitcells are accessed. The sense amplifiers buffer the bitlines from the readout circuit and may be configured to amplify readout signals as needed. Any number of suitable column/row select circuits and sense amplifiers can be used here, as will be apparent in light of this disclosure. The disclosure is not intended to be limited to any particular column/row select and sense circuitry; rather, any circuitry capable of selecting and reading out the value of a 1 T bitcell configured as provided herein can be used.

Figure 2A:
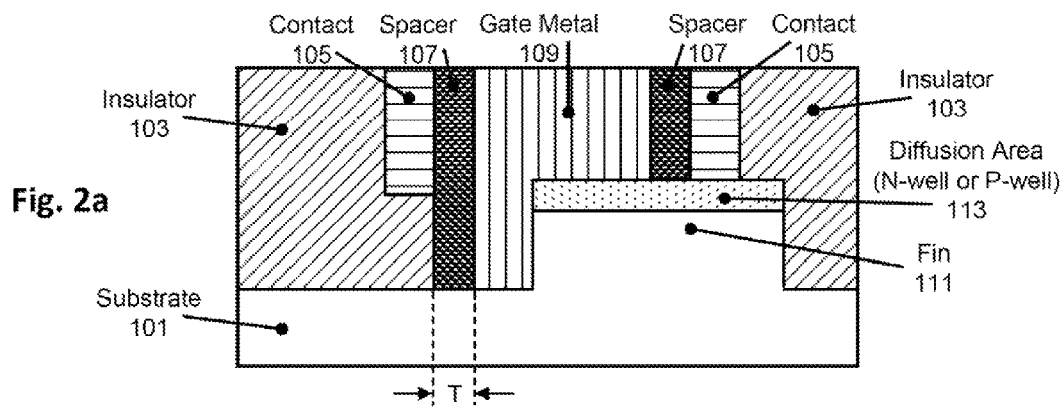
FIGS. 2a-c each illustrates a cross-section of an antifuse memory device structure configured in accordance with an embodiment of the present disclosure.
Figure 2B:
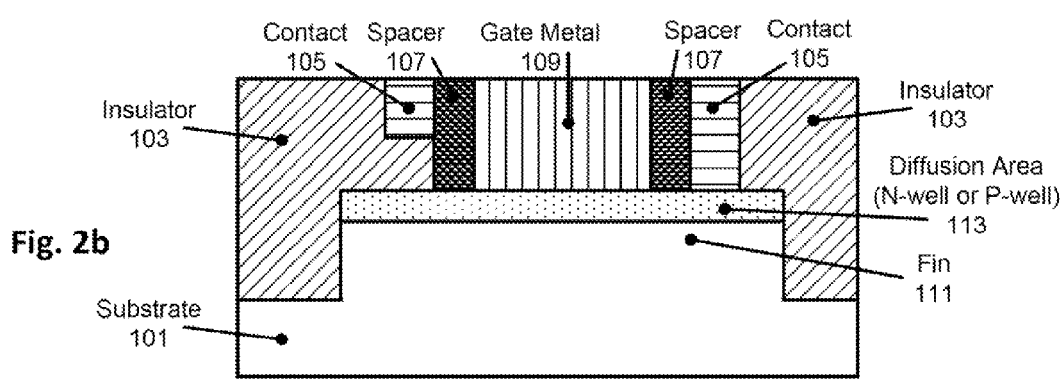
Figure 2C:
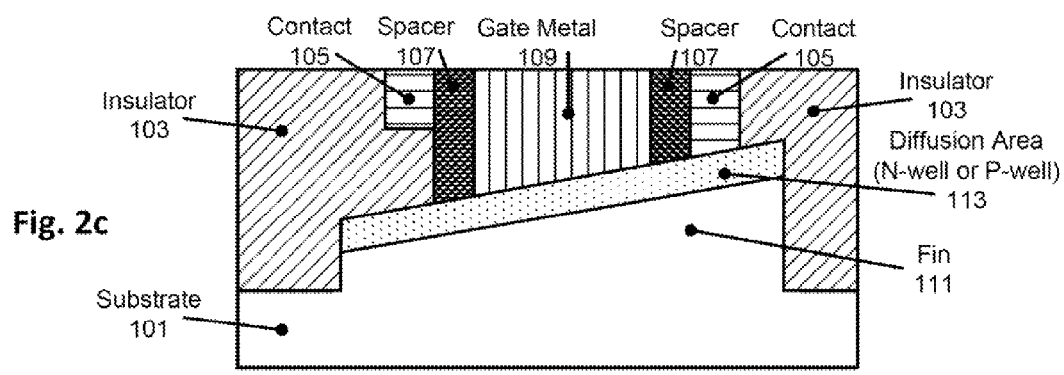

FIGS. 2a-c each illustrates a cross-section of an antifuse memory device structure configured in accordance with an embodiment of the present disclosure. As can be seen, this example embodiment includes a fin-based configuration. Note, however, that other embodiments may be similarly implemented using a planar configuration, as will be appreciated in light of this disclosure. Each cross-section shows one bitcell, but a plurality of such bitcells can be provisions to provide an array. Example processes for forming these structures will be discussed with reference to FIG. 6.

With reference to FIG. 2a, a substrate 101 is provided having a fin 111 formed thereon. Note that the cross-section is taken parallel to the fin 111. At least a portion of the top part of the fin 111 is doped (e.g., implantation and/or epitaxial deposition) to provide the diffusion area 113. As can be seen, the diffusion area 113 can be n-type to provide an N-well or p-type to provide a P-well, depending on the desired performance and application. Spacers 107 and gate metal 109 are intentionally provided in an unlanded or otherwise offset fashion, as further shown in FIG. 2a. Because of this offset, the contact trenches 105 in this example configuration can be etched to the same depth in the insulator 103 material.

Note that the left-side contact 105 is offset from the diffusion area 113 and effectively suspended in the insulator 103 material, so as to form a capacitor in conjunction with the dielectric spacer 107 material and the gate metal 109. Specifically, contact 105 and gate metal 109 respectively form the conductive electrodes or plates of the capacitor, and the spacer material 107 forms the capacitor's dielectric between those two electrodes. This capacitor is the antifuse element C of the bitcell. On the other hand, the right-side contact 105 is landed on the diffusion area 113, so as to form a diode in conjunction with gate metal 109 and diffusion area 113. Specifically, the interface of gate metal 109 and diffusion area 113 provides a metal-semiconductor junction, with the anode of that junction at gate metal 109 and the cathode at the right contact 105. Such a gate metal-diffusion junction forms a Schottky barrier or ohmic contact. Whether such a metal-semiconductor junction forms a Schottky barrier or ohmic contact depends on the Schottky barrier height of the junction, as is known. In any such cases, this is the selector element of the bitcell.

The various materials making up the bitcell structure can vary from one embodiment to the next, and will depend on the application as will be appreciated. In one example embodiment, the following materials can be used: the substrate 101 including fin 111 is silicon; the insulator material 103 is spin-on-glass (SOG) or other flowable isolation material that solidifies when cured, or silicon dioxide; the gate metal 109 is titanium, titanium nitride, or tantalum nitride; the spacer 107 is silicon nitride; the contacts 105 are tungsten, and the diffusion area can be doped with arsenic or phosphor to provide an N-well. N-Well formation can be carried out using patterned implant, as is often times done. Alternatively, an N-well can be formed through an etch and epitaxial deposition process, such as with epi doped silicate glass (e.g., phosphorus-doped silicate glass (PSG). In such cases, a heavily doped epi region can be formed by first etching the fin 111 at desired locations and then selectively grow epi at these locations. Note that such materials are appropriate for n-type antifuse devices (N-well). As will be appreciated, however, the techniques provided herein can also be used for p-type devices (P-well). For instance, in such p-type cases, the work function metal and P-well doping level can be selected to ensure that the Schottky barrier is fulfilling the breakdown and turn-on voltages' requirements desired for a given application. In such cases, the P-well dopant could be, for example, boron or boron-doped silicate glass (BSG) and the epitaxial deposition to provide the diffusion 113 could be, for example, silicon germanium (SiGe). The present disclosure is not intended to be limited to any particular material systems or biasing schemes. Rather, a 1 T bitcell configuration employing a vertical spacer material breakdown voltage as variously provided herein can be implemented with numerous material systems or biasing schemes, as will be further appreciated in light of this disclosure.

As can be seen now with reference to FIG. 2b, a structure similar to that shown in FIG. 2a is provided, except that the spacers 107 and gate metal 109 are not intentionally provided in an unlanded or otherwise offset fashion. Rather, the spacers 107 and gate metal 109 effectively land on the top of fin 111. Note that this could also be a planar configuration (rather than a fin-based configuration). In any case, note that the contact trenches 105 in this example configuration are etched to different depths in the insulator 103 material. Specifically, the left contact 105 trench is shallow etched such that it does not reach the diffusion area 113, and the right contact 105 trench is deep etched such that is does reach the diffusion area 113. The resulting structure yields a 1 T bitcell that operates in a similar fashion as the 1 T bitcell shown in FIG. 2a. The relevant previous discussion with respect to FIG. 2a is equally applicable here, as will be appreciated.

As can be seen now with reference to FIG. 2c, a structure similar to that shown in FIG. 2b is provided, except that top of the fin 111 is tapered. Note that this could also be a planar configuration (rather than a fin-based configuration), if so desired. In any case, note that the contact trenches 105 in this example configuration are etched to the same depth in the insulator 103 material. However, because of the tapered surface of fin 111 (or other surface), the left contact 105 trench does not reach the diffusion area 113, and the right contact 105 trench does reach the diffusion area 113. The resulting structure yields a 1 T bitcell that operates in a similar fashion as the 1 T bitcell shown in FIGS. 2a and 2b. The relevant previous discussion with respect to FIGS. 2a-2b is equally applicable here.

Bitcell Programming/Reading

FIG. 3a schematically illustrates an unprogrammed 1 T bitcell of an antifuse memory device configured in accordance with an embodiment of the present disclosure. As can be seen, the antifuse element C still has capacitive-like qualities (two conductive plates sandwiching a dielectric material). The program voltage ($V_{Prog}$) can be applied via the wordline corresponding to that bitcell. During programming of a given bitcell, the diode D for that bitcell is forward biased so as to allow current to flow on the corresponding wordline and through the capacitor C of that bitcell to the corresponding bitline. This forward biasing is achieved by applying appropriate voltages to the corresponding wordline and bitline for that bitcell. The diodes of other bitcells in the same row as that bitcell being programmed are reverse biased by an appropriate voltage provided on their corresponding bitlines. Likewise, the diodes of other bitcells in the same column as that bitcell being programmed are reverse biased by an appropriate voltage provided on their corresponding wordlines. So, one bitcell can be programmed (or read) at a time.

FIG. 3b schematically illustrates a programmed 1 T bitcell of an antifuse memory device configured in accordance with an embodiment of the present disclosure. As can be seen, the antifuse element C has been programmed or effectively converted to a resistor R. This resistance operates in conjunction with a resistance of the readout circuit so as to provide an indication of its programmed value (either a 1 or a 0, as the case may be). As will be appreciated in light of this disclosure, the conversion of the vertical spacer material 107 to a resistor-like element R can be done in a similar fashion as the gate dielectric of a conventional antifuse element is programmed. The read voltage ($V_{Read}$) can be applied via the wordline corresponding to that bitcell.

FIG. 3c illustrates the various integrated circuit layers comprising a 1 T bitcell of an antifuse memory device configured as discussed with reference to FIGS. 2a-c, in accordance with an embodiment. As can be seen, the CSG junction (Contact 105/Spacer 107/Gate Metal 109) forms the antifuse element C (or R after programming), and the Gate-to-Diffusion junction forms the diode-based selector element D. Again, note that the program voltage ($V_{Prog}$) and the read voltage ($V_{Read}$) can be applied via the wordline corresponding to that bitcell during programming and read-out operations, respectively.

FIGS. 4a-b illustrate current-voltage characteristics of a 1 T bitcell of an antifuse memory device configured in accordance with an embodiment of the present disclosure. In particular, FIG. 4a shows that the gate-to-diffusion (metal-semiconductor) junction begins to conduct when the forward diode voltage drop ($V_{Diode}$) is reached. The magnitude of the reverse breakdown voltage ($-V_{Diode}$) is typically higher than the forward threshold voltage. FIG. 4b shows the breakdown voltage ($V_{BD}$) of the vertical spacer material 107, which is generally the same regardless of current flow direction (i.e., $V_{BD} \cong -V_{BD}$). In one example embodiment, the Schottky diode forward voltage drop $V_{Diode}$ is in the range of about 0.15 v to 0.45 v, and the breakdown voltage $V_{BD}$ of the vertical spacer material 107 is in the range of about 0.5 v to 3.5 v. As can be further seen in FIG. 4a, the reverse breakdown voltage of the diode is a function of the breakdown voltage $V_{BD}$ of the vertical spacer material 107 plus $V_{Diode}$, which in the aggregate is generally much greater in magnitude (e.g., 5× greater or more, in one example embodiment) than the forward diode voltage drop $V_{Diode}$. The actual breakdown voltages of the spacer material 107 can vary greatly from one embodiment to the next, depending on factors such as the type and geometry of the spacer material 107 as well as the available biasing voltages, as will be appreciated. Any given dielectric spacer material 107 having a known thickness T (as shown in FIG. 2a) will have a known dielectric strength rating (e.g., MV/m, or $10^6$ Volt/meter) from which the breakdown voltage $V_{BD}$ can be estimated.

Figure 5A:
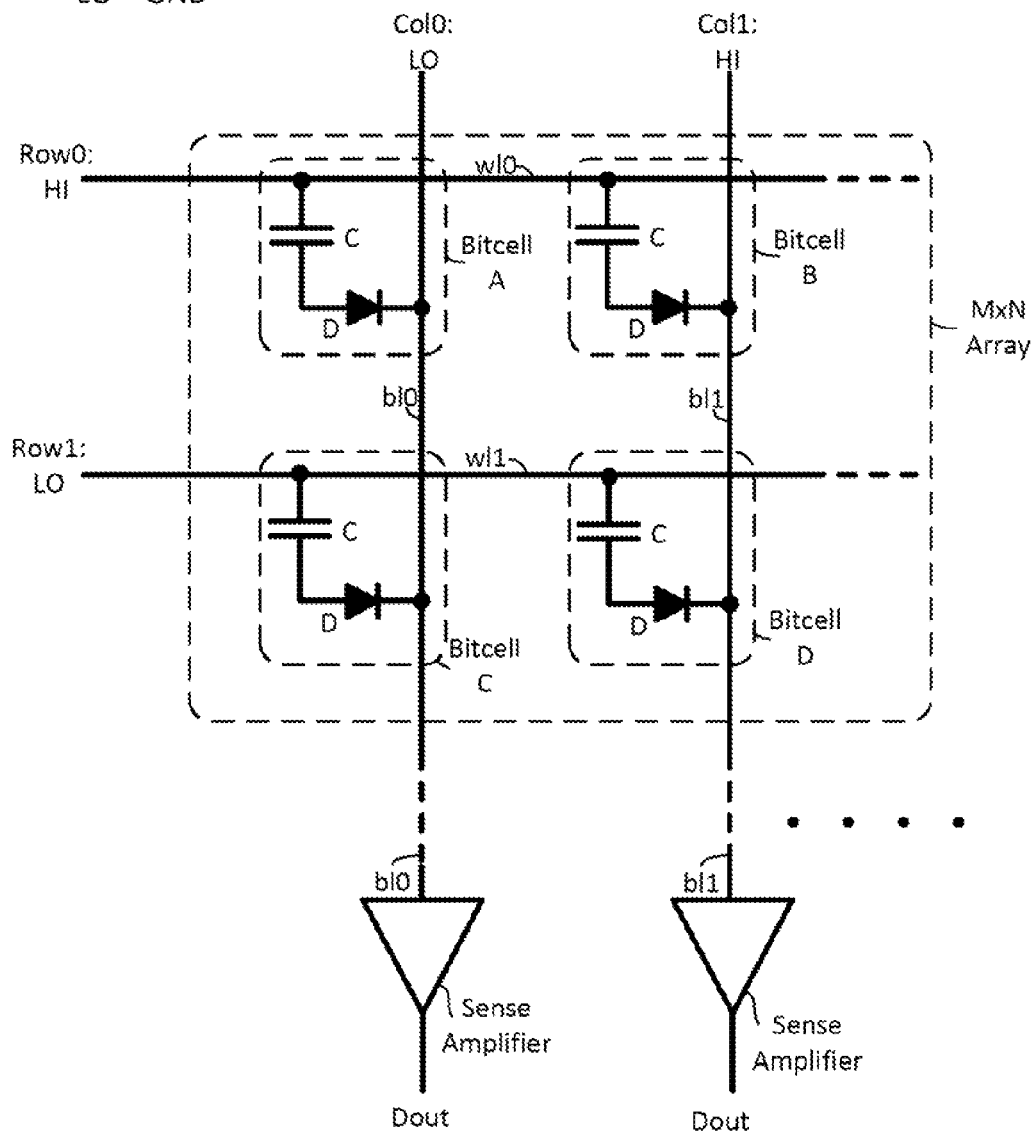
FIG. 5a illustrates an example scheme for programming an antifuse memory device configured in accordance with an embodiment of the present disclosure.

As will be appreciated, the voltages applied at the row-based wordlines and the column-based bitlines can be set to bias a given cell so that programming or readout can take place, while other bitcells are left in a non-conducting or otherwise inactive state. The HI-LO voltages applied to the bitlines can be the same as the HI-LO voltages applied to the wordlines in some example embodiments, but in other embodiments the bitline HI-LO voltages are different from the wordline HI-LO voltages. FIG. 5a illustrates an example scheme for programming an antifuse memory device configured in accordance with an embodiment of the present disclosure. In this example configuration, the bitline HI-LO voltages are the same as the wordline HI-LO voltages. The following equations apply with respect to bitcell operation for this example embodiment:

$$V_{Prog} > V_{BD} + V_{Diode} + V_{NW} \quad \text{(Equation 1)}$$

$$|V_{BD}, V_{Diode}| > V_{Prog} \quad \text{(Equation 2)}$$

$$V_{Read} > V_{NW} + V_{Diode} \quad \text{(Equation 3)}$$

Here, $V_{Prog}$ is the programming voltage applied to the wordline by the row select circuitry during programming, $V_{Read}$ is the programming voltage applied to the wordline by the row select circuitry during readout, $V_{BD}$ is the breakdown voltage of the vertical spacer material 107, $V_{Diode}$ is the voltage drop across the Schottky junction, and $V_{NW}$ is the voltage drop across the diffusion area 113 (which is an N-well in this example case).

As can be seen, bitcell A is being programmed. In particular, a programming voltage HI ($V_{Prog}$) is applied to wordline wl0 and a low voltage LO (ground) is applied to bitline bl0. These voltage levels cause the diode D of bitcell A to forward bias, and the programming voltage HI (less $V_{Diode}$) is dropped across the antifuse element C of bitcell A for a duration of time, thereby causing that antifuse element to have a resistance R within a certain range (as shown in FIG. 3b). Note that $V_{Prog}$ needs to be high enough to provide enough potential to breakdown the vertical spacer 107 in addition to the voltage drop at Schottky junction ($V_{Diode}$) and the N-well ($V_{NW}$). Bitcell B is not activated or is otherwise left unaffected because the same voltage HI is applied to both wordline wl0 and bitline bl1 thereby preventing the diode D of bitcell B from becoming forward biased and as such any voltage drop across antifuse element C of bitcell B. In a similar fashion, Bitcell C is left unaffected because the same voltage LO is applied to both wordline wl1 and bitline bl0 thereby preventing the diode D of bitcell C from becoming forward biased and as such any voltage drop across antifuse element C of bitcell C. Bitcell D is effectively reverse biased because the voltage LO is applied to wordline wl1 and voltage HI is applied to bitline bl1. In this case, the diode D of Bitcell D prevents any reverse current flow and as such any voltage drop across antifuse element C of bitcell D. For bitcell D, note that $V_{BD}, V_{Diode}$ needs to sustain $V_{Prog}$ to prevent breakdown. As will be further appreciated, a read operation can be carried out in a similar fashion as a program operation, but change $V_{Prog}$ to $V_{Read}$. $V_{Read}$ is typically a lower voltage than $V_{Prog}$. In one example case, $V_{Prog}$ is in the 2.5 v to 5.0 v range, and $V_{Read}$ is in the 0.8 v to 1.5 v range. Numerous other voltage schemes can be used and the present disclosure is not intended to be limited to any particular such scheme, as will be appreciated.

Figure 5B:
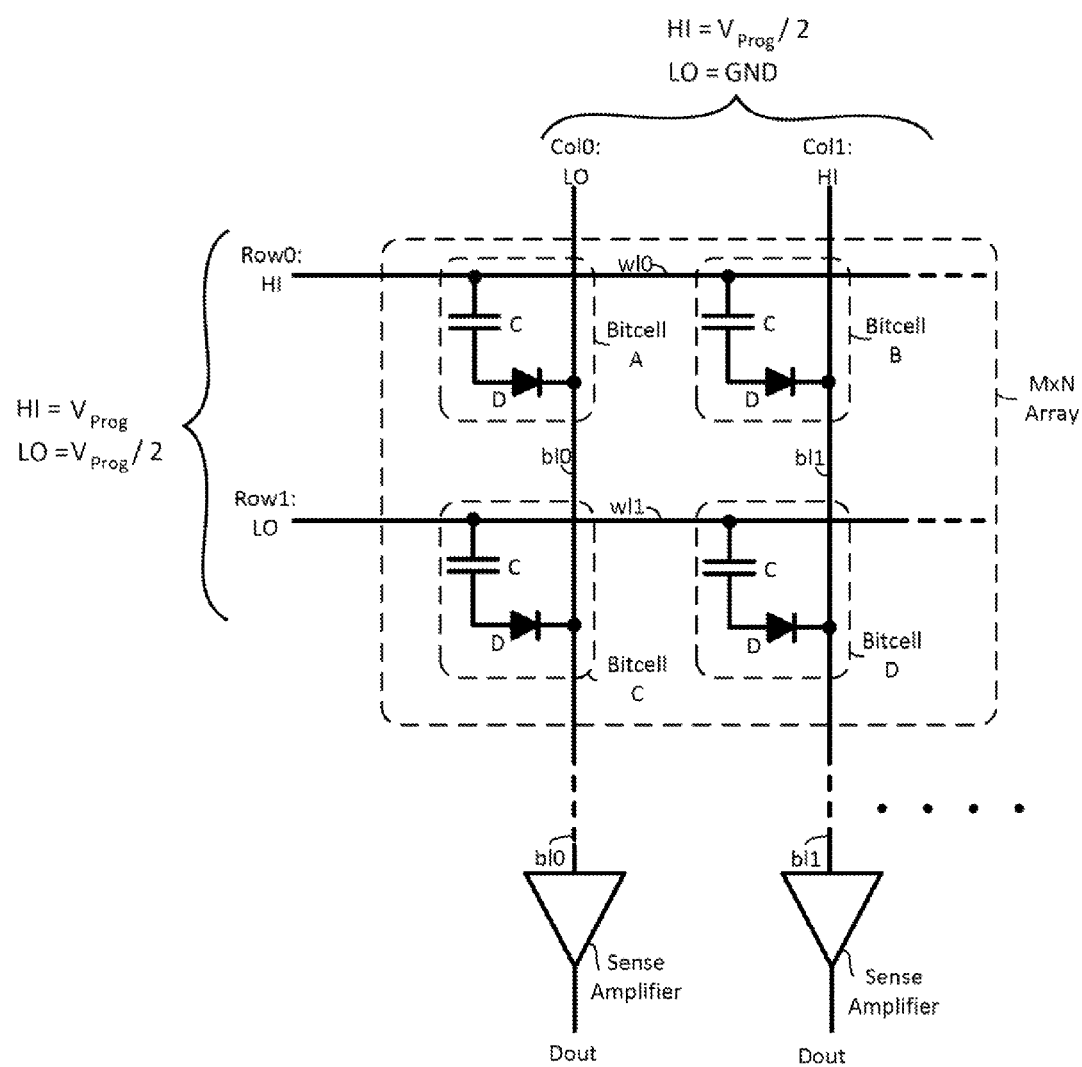
FIG. 5b illustrates another example scheme for programming an antifuse memory device configured in accordance with an embodiment of the present disclosure.

FIG. 5b illustrates another example scheme for programming an antifuse memory device configured in accordance with an embodiment of the present disclosure. In this example configuration, the bitline HI-LO voltages are different from the wordline HI-LO voltages. The following equations apply with respect to bitcell operation for this example embodiment:

$$V_{Prog} > V_{BD} + V_{Diode} + V_{NW} \quad \text{(Equation 4)}$$

$$|V_{BD}, V_{Diode}| > V_{Prog}/2 \quad \text{(Equation 5)}$$

$$V_{Read} > V_{NW} + V_{Diode} \quad \text{(Equation 6)}$$

The HI and LO voltages for the wordlines are $V_{Prog}$ and $V_{Prog}/2$, respectively. The HI and LO voltages for the bitlines are $V_{Prog}/2$ and GND (ground or 0 v), respectively. As can be seen, bitcell A is being programmed.

In particular, a programming voltage HI ($V_{Prog}$) is applied to wordline wl0 and a low voltage LO (ground) is applied to bitline bl0. These voltage levels cause the diode D of bitcell A to forward bias, and the programming voltage HI (less $V_{Diode}$) is dropped across the antifuse element C of bitcell A for a duration of time, thereby causing that antifuse element to have a resistance R. Note that $V_{Prog}$ needs to be high enough to provide enough potential to breakdown the vertical spacer 107 in addition to the voltage drop at Schottky junction ($V_{Diode}$) and the N-well ($V_{NW}$). Bitcell B is not activated because the voltage HI ($V_{Prog}$) is applied to wordline wl0 and voltage HI ($V_{Prog}/2$) is applied to bitline bl1 which results in $V_{Prog}/2$ being dropped across bitcell B, which is insufficient to cause any breakdown or programming effect. In a similar fashion, Bitcell C is not activated because the voltage LO ($V_{Prog}/2$) is applied to wordline wl1 and voltage LO (GND) is applied to bitline bl0 which results in $V_{Prog}/2$ being dropped across bitcell C, which is insufficient to cause any breakdown or programming effect. For bitcells B and C, note that $V_{BD}, V_{Diode}$ needs to sustain $V_{Prog}/2$ to prevent breakdown. Bitcell D is left unaffected because the same voltage ($V_{Prog}/2$) is applied to both wordline wl1 and bitline bl1 thereby preventing the diode D of bitcell D from becoming forward biased and as such any voltage drop across antifuse element C of bitcell D. As will be further appreciated, a read operation can be carried out in a similar fashion as a program operation, but change $V_{Prog}$ to $V_{Read}$ and $V_{Prog}/2$ to $V_{Read}/2$. Note that if an output voltage (Dout) of less than 0 v is allowed, then all voltages can be shifted down by $V_{Prog}/2$ to save standby power.

Methodology

Note that a bitcell configuration as provided herein can be implemented using any standard transistor device process, such as a CMOS device process where a gate stack is formed, and then source and drain regions and contacts are formed. In some cases, the initial gate stack may include sacrificial gate materials that are subsequently removed using a remove metal gate or so-called RMG process. In general, any such processing schemes can be used to implement a bitcell configuration as described herein, with modifications to account for the lack of gate dielectric, the diffusion area 113, and the asymmetric nature of the trench-based contacts 105 (whether by an unlanded or offset gate trench, or a tapered/slanted diffusion area 113, or a shallow-deep pair of trench-based contacts 105).

Figure 6:
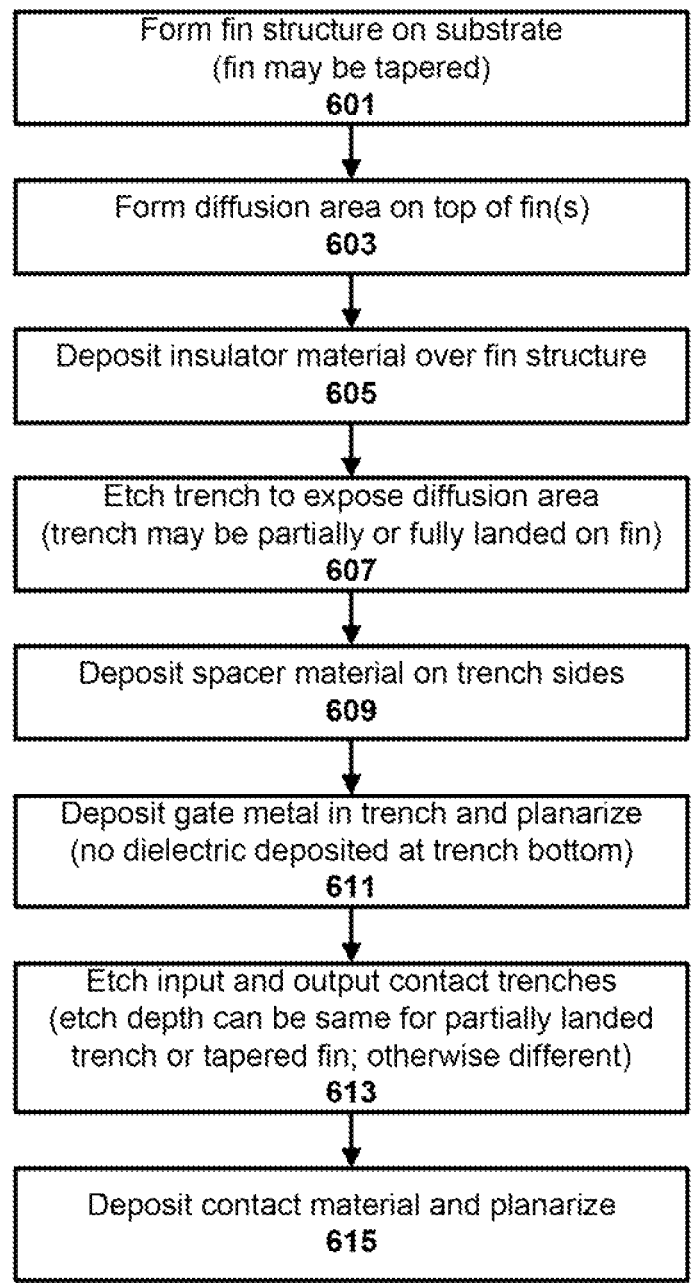
FIG. 6 illustrates a methodology for making an antifuse memory device configured in accordance with an embodiment of the present disclosure.

FIG. 6 illustrates a methodology for making an antifuse memory device configured in accordance with an embodiment of the present disclosure. Reference may be made to the example structures shown in FIGS. 2a-c to further understanding. The method includes forming 601 a fin structure on substrate. In some embodiments, the resulting fin 111 may be tapered as shown in FIG. 2c. In still other embodiments, no fin 111 is needed. Rather, a planar transistor architecture can also be used, where the plane upon which the device is fabricated is slanted (as shown in FIG. 2c) or where the trench-based contacts are etched to different depths (FIG. 2b). For purposes of this example embodiment, assume that a fin-based configuration is desired.

The method continues with forming 603 a diffusion area on top of fin(s). In one example case, the diffusion is n-type, wherein an N-well is formed by patterned implantation of a suitable n-type dopant. Alternatively, the N-well can be epitaxially formed on the fin top surface, by first etching the fins at desired locations then selectively provisioning an epi growth at those locations. In one such example case, the epi growth is implemented with doped silicate glass (e.g., PSG). Recall that other embodiments may be implemented with a P-well using a suitable p-type dopant (e.g., BSG). The method continues with depositing 605 insulator material over fin structure. The insulator material may be any suitable dielectric that can be flowed or otherwise deposited on to the structure. Planarization and other intermediate processes may be used as necessary.

The method continues with etching 607 a trench to expose the diffusion area. As previously explained, the trench may be partially-landed (FIG. 2a) or fully-landed (FIG. 2b) on fin 111, depending on the desired configuration. The method continues with depositing 609 spacer material on trench sides, and depositing 611 gate metal in the trench (and any desired planarizing). As previously explained, no dielectric or gate oxide need be deposited at the trench bottom, as would be done for transistor fabrication. Note that the forming process may be taken in any number of sequences, and the depiction in FIG. 6 is not intended to implicate a specific order of processing steps. Rather, numerous such methodologies will be apparent in light of this disclosure.

The method continues with etching 613 the input and output contact trenches. As previously explained, the trench-based contacts 105 can be implemented in an asymmetric fashion. For instance, if the gate trench is offset as shown in FIG. 2a, then the left and right-side contact trenches can be the same depth, but the right-side contact trench lands on the diffusion 113 and the left-side contact trench remains suspended. Alternatively, if the diffusion area 113 is tapered or otherwise configured with non-uniform height (as shown in FIG. 2c), the contact trenches can be the same depth if so desired, wherein the up-slope contact trench reaches the diffusion area 113 and the down-slope contact trench does not. In other such cases, the down-slope contact trench can be shallower than the up-slope contact trench. In still another alternative embodiment, if the gate trench lands completely on a flat surface of uniform height (as shown in FIG. 2b), then one trench can be deeper so as to reach the diffusion area 113 and the other trench can be shallower and not reach the diffusion area 113. The method continues with depositing 615 the contact material into the trenches and planarizing as necessary.

System

Figure 7:
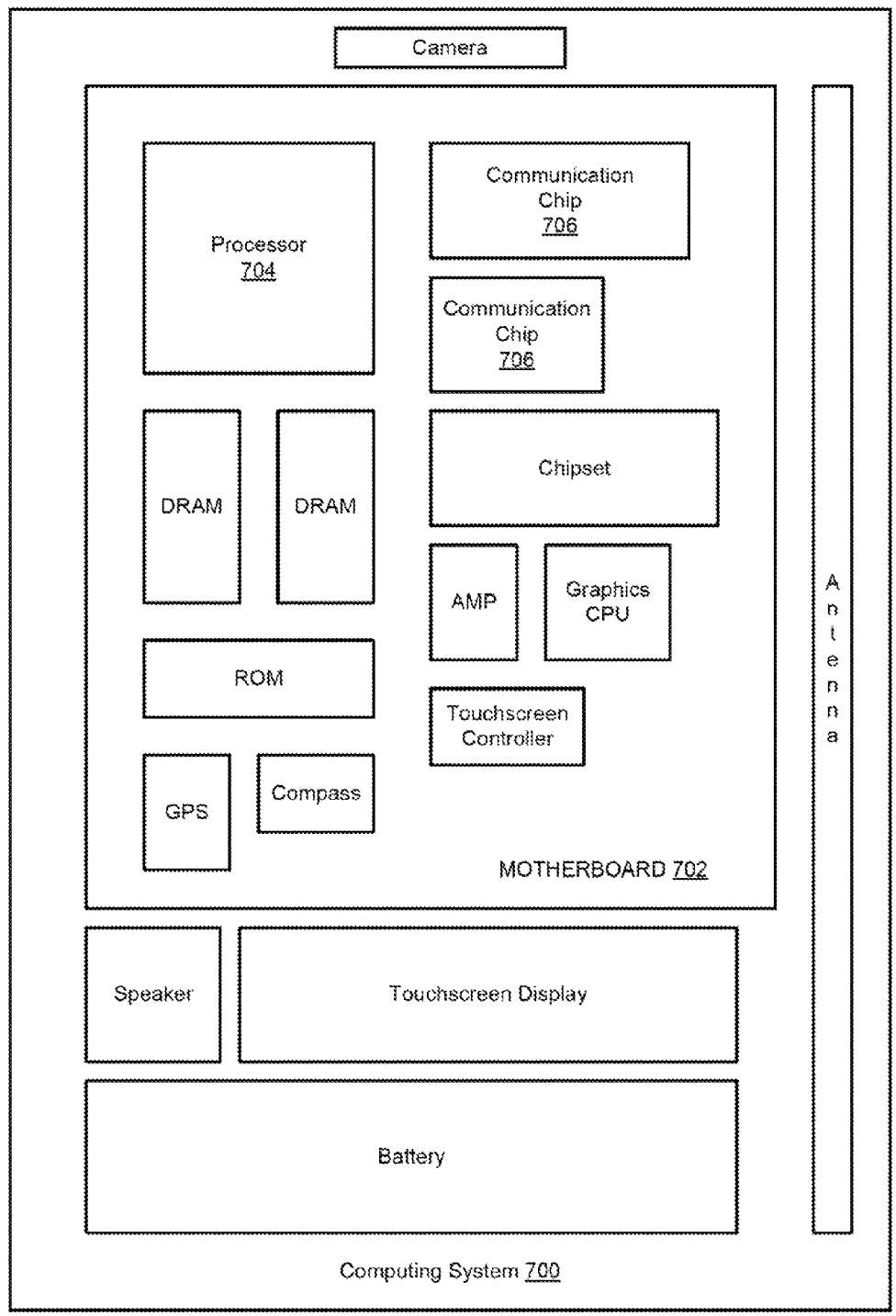
FIG. 7 illustrates a computing system implemented with antifuse memory configured in accordance with an embodiment of the present disclosure.

FIG. 7 illustrates a computing system implemented with antifuse memory configured in accordance with an embodiment of the present disclosure. As can be seen, the computing system 700 houses a motherboard 702. The motherboard 702 may include a number of components, including, but not limited to, a processor 704 and at least one communication chip 706, each of which can be physically and electrically coupled to the motherboard 702, or otherwise integrated therein. As will be appreciated, the motherboard 702 may be, for example, any printed circuit board, whether a main board, a daughterboard mounted on a main board, or the only board of system 700, etc. Depending on its applications, computing system 700 may include one or more other components that may or may not be physically and electrically coupled to the motherboard 702. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 700 may include one or more integrated circuit structures or devices formed using the techniques disclosed herein. In some embodiments, multiple functions can be integrated into one or more chips (e.g., for instance, note that the communication chip 706 can be part of or otherwise integrated into the processor 704).

The communication chip 706 enables wireless communications for the transfer of data to and from the computing system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing system 700 includes an integrated circuit die packaged within the processor 704.

In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 706 also may include an integrated circuit die packaged within the communication chip 706. In accordance with some such example embodiments, the integrated circuit die of the communication chip includes one or more integrated circuit structures or devices as described herein. As will be appreciated in light of this disclosure, note that multi-standard wireless capability may be integrated directly into the processor 704 (e.g., where functionality of any chips 706 is integrated into processor 704, rather than having separate communication chips). Further note that processor 704 may be a chip set having such wireless capability. In short, any number of processor 704 and/or communication chips 706 can be used. Likewise, any one chip or chip set can have multiple functions integrated therein.

In various implementations, the computing device 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices, as variously described herein.

Further Example Embodiments

The following examples pertain to further embodiments, from which numerous permutations and configurations will be apparent.

Example 1 is a memory device bitcell, comprising: a semiconductor substrate having a surface; a diffusion area on or in the surface of the semiconductor substrate; first and second vertical dielectric spacers, at least one of those spacers being over and in contact with the diffusion area; metal deposited between and in contact with the first and second vertical dielectric spacers, the metal also being at least partially in contact with the diffusion area; a first trench-based conductive contact that is not in contact with the diffusion area but forms an antifuse element in conjunction with the first vertical dielectric spacer and the metal; and a second trench-based conductive contact that is in contact with the diffusion area and forms a selector element in conjunction with the diffusion area and the metal.

Example 2 includes the subject matter of Example 1, further comprising an insulator material layer over the substrate and in which the first and second vertical dielectric spacers, metal, and first and second trench-based conductive contacts reside.

Example 3 includes the subject matter of any of Examples 1 or 2, wherein the semiconductor substrate comprises a fin and the surface comprises the top of the fin.

Example 4 includes the subject matter of any of the previous Examples, wherein the surface has a non-uniform height.

Example 5 includes the subject matter of any of the previous Examples, wherein the surface is slanted.

Example 6 includes the subject matter of any of the previous Examples, wherein the diffusion area is slanted or otherwise has a non-uniform height.

Example 7 includes the subject matter of any of the previous Examples, wherein the diffusion area comprises an N-well.

Example 8 includes the subject matter of any of Examples 1-6, wherein the diffusion area comprises a P-well.

Example 9 includes the subject matter of any of the previous Examples, wherein the first and second vertical dielectric spacers are both over and in contact with the diffusion area.

Example 10 includes the subject matter of any of the previous Examples, wherein the first and second vertical dielectric spacers are both the same height.

Example 11 includes the subject matter of any of Examples 1-9, wherein one of the first and second vertical dielectric spacers is longer than the other one.

Example 12 includes the subject matter of any of Examples 1-8 wherein only one of the first and second vertical dielectric spacers is over and in contact with the diffusion area, and the other spacer is over and in contact with another area of the substrate.

Example 13 includes the subject matter of Example 12, wherein the semiconductor substrate comprises a fin and the surface comprises the top of the fin, and the another area of the substrate is an area that is adjacent to the fin.

Example 14 includes the subject matter of any of the previous Examples, wherein one of the first and second trench-based conductive contacts is longer than the other one.

Example 15 includes the subject matter of any of Examples 1-13, wherein the first and second trench-based conductive contacts are the same height.

Example 16 includes the subject matter of Example 1, wherein the metal partially lands on the diffusion.

Example 17 includes the subject matter of Example 16, wherein the vertical dielectric spacer in contact with the unlanded portion of the metal is longer than the vertical dielectric spacer in contact with the landed portion.

Example 18 includes the subject matter of Example 16 or 17, wherein the first and second trench-based conductive contacts have the same length.

Example 19 includes the subject matter of Example 16 or 17, wherein one of the first and second trench-based conductive contacts is longer than the other one.

Example 20 includes the subject matter of Example 1, wherein the metal completely lands on the diffusion.

Example 21 includes the subject matter of Example 20, wherein one of the vertical dielectric spacers is longer than the other because the diffusion has a non-uniform height.

Example 22 includes the subject matter of Example 20 or 21, wherein one of the vertical dielectric spacers is longer than the other because the diffusion is slanted.

Example 23 includes the subject matter of any of Examples 20-22, wherein the first and second trench-based conductive contacts have the same length.

Example 24 includes the subject matter of any of Examples 20-22, wherein the first trench-based conductive contact has a different length than the second trench-based conductive contact.

Example 25 includes a memory device comprising an array of bitcells of any of Examples 1-24.

Example 26 includes an integrated circuit comprising the memory device of Example 25. In some such example cases, the integrated circuit can be a processor or a communication chip.

Example 27 includes a storage system comprising the subject matter of any of Examples 24-26, further comprising at least one of: column select circuitry for selecting a column of the array; row select circuitry for selecting a row of the array; and sense amplifier circuitry for sensing bitcell state during readout.

Example 28 includes a memory device, comprising: an array of bitcells formed on a semiconductor substrate, each bitcell comprising: a surface of the substrate; a diffusion area on or in the surface of the semiconductor substrate; first and second vertical dielectric spacers, at least one of those spacers being over and in contact with the diffusion area; metal deposited between and in contact with the first and second vertical dielectric spacers, the metal also being at least partially in contact with the diffusion area; a first trench-based conductive contact that is not in contact with the diffusion area but forms an antifuse element in conjunction with the first vertical dielectric spacer and the metal; a second trench-based conductive contact that is in contact with the diffusion area and forms a selector element in conjunction with the diffusion area and the metal; and an insulator material layer over the substrate and in which the first and second vertical dielectric spacers, metal, and first and second trench-based conductive contacts reside; column select circuitry for selecting a column of the array; and row select circuitry for selecting a row of the array.

Example 29 includes the subject matter of Example 28, wherein the semiconductor substrate comprises a fin and the surface comprises a top portion of the fin.

Example 30 includes the subject matter of Example 28 or 29, wherein the metal of at least some of the bitcells partially lands on the corresponding diffusion of that bitcell.

Example 31 includes the subject matter of Example 30, wherein, for the at least some bitcells, the vertical dielectric spacer in contact with the unlanded portion of the metal is longer than the vertical dielectric spacer in contact with the landed portion.

Example 32 includes the subject matter of Example 30 or 31, wherein, for the at least some bitcells, the first and second trench-based conductive contacts have the same length.

Example 33 includes the subject matter of Example 30 or 31, wherein, for the at least some bitcells, one of the first and second trench-based conductive contacts is longer than the other one.

Example 34 includes the subject matter of Example 28 or 29 wherein the metal of at least some of the bitcells completely lands on the corresponding diffusion of that bitcell.

Example 35 includes the subject matter of Example 34, wherein, for the at least some bitcells, one of the vertical dielectric spacers is longer than the other because the diffusion has a non-uniform height.

Example 36 includes the subject matter of Example 34 or 35, wherein, for the at least some bitcells, one of the vertical dielectric spacers is longer than the other because the diffusion is slanted.

Example 37 includes the subject matter of any of Examples 34-36, wherein, for the at least some bitcells, the first and second trench-based conductive contacts have the same length.

Example 38 includes the subject matter of any of Examples 34-36, wherein the first trench-based conductive contact has a different length than the second trench-based conductive contact.

Example 39 includes a method for making a bitcell, comprising: providing a semiconductor substrate having a surface; providing a diffusion area on or in the surface of the semiconductor substrate; providing first and second vertical dielectric spacers, at least one of those spacers being over and in contact with the diffusion area; depositing metal between and in contact with the first and second vertical dielectric spacers, the metal also being at least partially in contact with the diffusion area; providing a first trench-based conductive contact that is not in contact with the diffusion area but forms an antifuse element in conjunction with the first vertical dielectric spacer and the metal; and providing a second trench-based conductive contact that is in contact with the diffusion area and forms a selector element in conjunction with the diffusion area and the metal.

Example 40 includes the subject matter of Example 39, and further includes providing an insulator material layer over the substrate, wherein the first and second vertical dielectric spacers, metal, and first and second trench-based conductive contacts reside within the insulator material layer.

Example 41 includes the subject matter of Example 39 or 40, wherein the semiconductor substrate comprises a fin and the surface comprises a top portion of the fin.

Example 42 includes the subject matter of any of Examples 39-41, and further includes providing the surface to have a non-uniform height.

Example 43 includes the subject matter of any of Examples 39-42, wherein the surface is slanted.

Example 44 includes the subject matter of any of Examples 39-43, wherein the diffusion area is slanted or otherwise has a non-uniform height given its relationship to the corresponding surface.

Example 45 includes the subject matter of any of Examples 39-44 wherein the metal partially lands on the diffusion.

Example 46 includes the subject matter of Example 45, wherein the vertical dielectric spacer in contact with the unlanded portion of the metal is longer than the vertical dielectric spacer in contact with the landed portion.

Example 47 includes the subject matter of Example 45 or 46, wherein the first and second trench-based conductive contacts have the same length.

Example 48 includes the subject matter of Example 45 or 46, wherein one of the first and second trench-based conductive contacts is longer than the other one.

Example 49 includes the subject matter of any of Examples 39-44 wherein the metal completely lands on the diffusion.

Example 50 includes the subject matter of Example 49, wherein one of the vertical dielectric spacers is longer than the other because the diffusion has a non-uniform height.

Example 51 includes the subject matter of Example 49 or 50, wherein one of the vertical dielectric spacers is longer than the other because the diffusion is slanted.

Example 52 includes the subject matter of any of Examples 49-51, wherein the first and second trench-based conductive contacts have the same length.

Example 53 includes the subject matter of any of Examples 49-51, wherein the first trench-based conductive contact has a different length than the second trench-based conductive contact.

Example 54 includes the subject matter of Example 39 wherein the metal partially lands on the diffusion, and wherein the vertical dielectric spacer in contact with the unlanded portion of the metal is longer than the vertical dielectric spacer in contact with the landed portion.

Example 55 includes the subject matter of Example 39 wherein the metal completely lands on the diffusion, and wherein one of the vertical dielectric spacers is longer than the other because the diffusion is slanted or otherwise has a non-uniform height and/or the first trench-based conductive contact has a different length than the second trench-based conductive contact.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. A memory device bitcell, comprising:
   a diffusion area on or in a semiconductor body;
   first and second vertical dielectric spacers, at least one of those spacers being over and in contact with the diffusion area;
   metal between and in contact with the first and second vertical dielectric spacers, the metal also being at least partially in contact with the diffusion area;
   a first trench-based conductive contact that is not in contact with any diffusion area but forms an antifuse element in conjunction with the first vertical dielectric spacer and the metal; and
   a second trench-based conductive contact that is in contact with the diffusion area and forms a selector element in conjunction with the diffusion area and the metal.

2. The bitcell of claim 1 further comprising an insulator material layer over the semiconductor body and in which the first and second vertical dielectric spacers, metal, and first and second trench-based conductive contacts reside.

3. The bitcell of claim 1 wherein the semiconductor body comprises a fin and the diffusion area is one of part of the fin or on the fin.

4. The bitcell of any of claim 1 wherein the diffusion area is slanted or otherwise has a non-uniform height.

5. The bitcell of claim 1 wherein the diffusion area comprises an N-well.

6. The bitcell of claim 1 wherein the first and second vertical dielectric spacers are both over and in contact with the diffusion area.

7. The bitcell of claim 1 wherein one of the first and second vertical dielectric spacers is longer than the other one.

8. The bitcell of claim 1 wherein only one of the first and second vertical dielectric spacers is over and in contact with the diffusion area, and the other spacer is over and in contact with another area of the semiconductor body.

9. The bitcell of claim 8 wherein the semiconductor body comprises a fin and the diffusion area is on top of the fin, and the another area of the semiconductor body is an area that is adjacent to the fin.

10. The bitcell of claim 1 wherein one of the first and second trench-based conductive contacts is longer than the other one.

11. The bitcell of claim 1 wherein the metal partially lands on the diffusion area.

12. The bitcell of claim 11 wherein the vertical dielectric spacer in contact with the unlanded portion of the metal is longer than the vertical dielectric spacer in contact with the landed portion.

13. The bitcell of claim 11 wherein one of the first and second trench-based conductive contacts is longer than the other one.

14. The bitcell of claim 1 wherein the metal completely lands on the diffusion area.

15. The bitcell of claim 14 wherein one of the vertical dielectric spacers is longer than the other because the diffusion area is slanted or otherwise has a non-uniform height.

16. The bitcell of claim 14 wherein the first trench-based conductive contact has a different length than the second trench-based conductive contact.

17. A memory device comprising an array of bitcells of claim 1.

18. An integrated circuit comprising the memory device of claim 17, wherein the integrated circuit is a processor or a communication chip.

19. A memory device, comprising:
   an array of bitcells on a semiconductor substrate, each bitcell comprising:
      a diffusion area on or in a semiconductor substrate;
      first and second vertical dielectric spacers, at least one of those spacers being over and in contact with the diffusion area;
      metal between and in contact with the first and second vertical dielectric spacers, the metal also being at least partially in contact with the diffusion area;
      a first trench-based conductive contact that is not in contact with any diffusion area but forms an antifuse element in conjunction with the first vertical dielectric spacer and the metal;
      a second trench-based conductive contact that is in contact with the diffusion area and forms a selector element in conjunction with the diffusion area and the metal; and
      an insulator material layer over the semiconductor substrate and in which the first and second vertical dielectric spacers, metal, and first and second trench-based conductive contacts reside;
      wherein the semiconductor substrate comprises a fin and the diffusion area is on a top portion of the fin; and
   column select circuitry for selecting a column of the array; and
   row select circuitry for selecting a row of the array.

20. The device of claim 19 wherein the metal of at least some of the bitcells partially lands on the corresponding diffusion area of that bitcell, and wherein, for the at least some bitcells, the vertical dielectric spacer in contact with the unlanded portion of the metal is longer than the vertical dielectric spacer in contact with the landed portion.

21. The device of claim 19 wherein the metal of at least some of the bitcells completely lands on the corresponding diffusion area of that bitcell, and wherein, for the at least some bitcells, one of the vertical dielectric spacers is longer than the other because the diffusion area is slanted or otherwise has a non-uniform height and/or the first trench-based conductive contact has a different length than the second trench-based conductive contact.

22. A method for making a bitcell, comprising:
   providing a diffusion area on or in a semiconductor body;
   providing first and second vertical dielectric spacers, at least one of those spacers being over and in contact with the diffusion area;
   depositing metal between and in contact with the first and second vertical dielectric spacers, the metal also being at least partially in contact with the diffusion area;
   providing a first trench-based conductive contact that is not in contact with any diffusion area but forms an antifuse element in conjunction with the first vertical dielectric spacer and the metal; and providing a second trench-based conductive contact that is in contact with the diffusion area and forms a selector element in conjunction with the diffusion area and the metal.

23. The method of claim 22 wherein the diffusion area is slanted or otherwise has a substantially non-uniform height.

24. The method of claim 22 wherein the metal partially lands on the diffusion area, and wherein the vertical dielectric spacer in contact with the unlanded portion of the metal is longer than the vertical dielectric spacer in contact with the landed portion.

25. The method of claim 22 wherein the metal completely lands on the diffusion area, and wherein one of the vertical dielectric spacers is longer than the other because the diffusion area is slanted or otherwise has a non-uniform height and/or the first trench-based conductive contact has a different length than the second trench-based conductive contact.

* * * * *